(12) United States Patent  (10) Patent No.: US 9,007,837 B2
Kitagawa et al.  (45) Date of Patent: Apr. 14, 2015

(54) NON-VOLATILE MEMORY SYSTEM WITH RESET CONTROL MECHANISM AND METHOD OF OPERATION THEREOF

(71) Applicant: Sony Corporation, Tokyo (JP)

(72) Inventors: Makoto Kitagawa, Boise, ID (US); Wataru Otsuka, Boise, ID (US); Jun Sumino, Tokyo (JP); Takafumi Kunihiro, Tokyo (JP); Tomohito Tsushima, Tokyo (JP)

(73) Assignee: Sony Corporation, Tokyo (JP)

( * ) Notice: Subject to any disclaimer, the term of this patent is extended or adjusted under 35 U.S.C. 154(b) by 165 days.

(21) Appl. No.: 13/764,605

(22) Filed: Feb. 11, 2013

(65) Prior Publication Data

US 2014/0226390 A1  Aug. 14, 2014

(51) Int. Cl.
 *G11C 16/10* (2006.01)
 *G11C 13/00* (2006.01)

(52) U.S. Cl.
 CPC ............ *G11C 13/0069* (2013.01); *G11C 16/10* (2013.01); *G11C 13/003* (2013.01); *G11C 2013/0071* (2013.01); *G11C 2213/79* (2013.01)

(58) Field of Classification Search
 CPC .......... G11C 16/10; G11C 16/30; G11C 16/12
 USPC .......... 365/185.18, 185.27, 148, 158
 See application file for complete search history.

(56) References Cited

U.S. PATENT DOCUMENTS

| | | |
|---|---|---|
| 2012/0147689 A1 | 6/2012 | Scheuerlein et al. |
| 2012/0163066 A1 | 6/2012 | Maejima |
| 2012/0166901 A1 | 6/2012 | Kim |
| 2012/0168706 A1 | 7/2012 | Noh et al. |
| 2012/0211719 A1 | 8/2012 | Haimoto et al. |
| 2014/0146600 A1* | 5/2014 | Sohn et al. .................... 365/158 |

* cited by examiner

*Primary Examiner* — Jason Lappas
(74) *Attorney, Agent, or Firm* — Ishimaru & Associates LLP

(57) ABSTRACT

A method of operation of a non-volatile memory system includes: providing a control field effect transistor having a source electrode and a body-tie electrode; coupling a resistive storage element to the source electrode; and opening a well switch coupled to the body-tie electrode for increasing a well voltage and resetting the resistive storage element by the source electrode floating on the well voltage.

10 Claims, 5 Drawing Sheets

NON-VOLATILE MEMORY SYSTEM WITH RESET CONTROL MECHANISM AND METHOD OF OPERATION THEREOF

TECHNICAL FIELD

The present invention relates generally to a memory system, and more particularly to a system for managing group erase of individual cells in a non-volatile memory array.

BACKGROUND ART

The performance of non-volatile memory systems has improved over the past several years. Changes in technology management have pushed the non-volatile memory devices into cameras, computers, personal data assistants, smart phones, and proprietary business applications.

The current flash memory devices, based on charge storage technologies, have limited life spans due to damage of the charge storage layers during writes. The damage can be caused by physical weakening of the crystal structure used to store the charge. This condition is countered by limiting the number of writes and reads that an individual memory cell can undergo. The limited reliability of the cells has given rise to error correction strategies and distributed write operations in order to extend the useable life of the memory modules.

Other non-volatile memory technologies are in development that can increase the useable memory density while extending the lifetime reliability of the memory structures. These non-volatile memory technologies include spin transfer torque random access memory (STT-RAM) and resistive random access memory (R-RAM).

While the write of the individual cells can be grouped by a byte or word organization, the erase is performed on a block basis. The block erase can simultaneously erase 4K cells. An issue that has arisen in the new R-RAM technology is that the block erase may have insufficient current to reset all of the individual cells in the erase block. Some percentage of the cells can require additional voltage or current in order to switch states. This condition can be caused by the number of written cells in the erase block and the manufacturing distribution of the individual integrated circuit.

In order to verify that all of the individual cells were properly erased, a verify read must be performed in order to determine whether all of the individual cells were actually erased. This process can lead to iterative erase cycles being used to clear all of the data. The iterative erase cycles can consume additional power and increase background processing time.

Thus, a need still remains for a non-volatile memory system that can reduce or eliminate the need for an iterative erase cycles process. In view of the exponential growth in the use of non-volatile memory in personal electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a non-volatile memory system including: providing a control field effect transistor having a source electrode and a body-tie electrode; coupling a resistive storage element to the source electrode; and opening a well switch coupled to the body-tie electrode for increasing a well voltage and resetting the resistive storage element by the source electrode floating on the well voltage.

The present invention provides a non-volatile memory system, including: a control field effect transistor having a source electrode and a body-tie electrode; a resistive storage element coupled to the source electrode; and a well switch, coupled to the body-tie electrode, opened for increasing a well voltage and the resistive storage element reset with the source electrode elevated by the well voltage.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
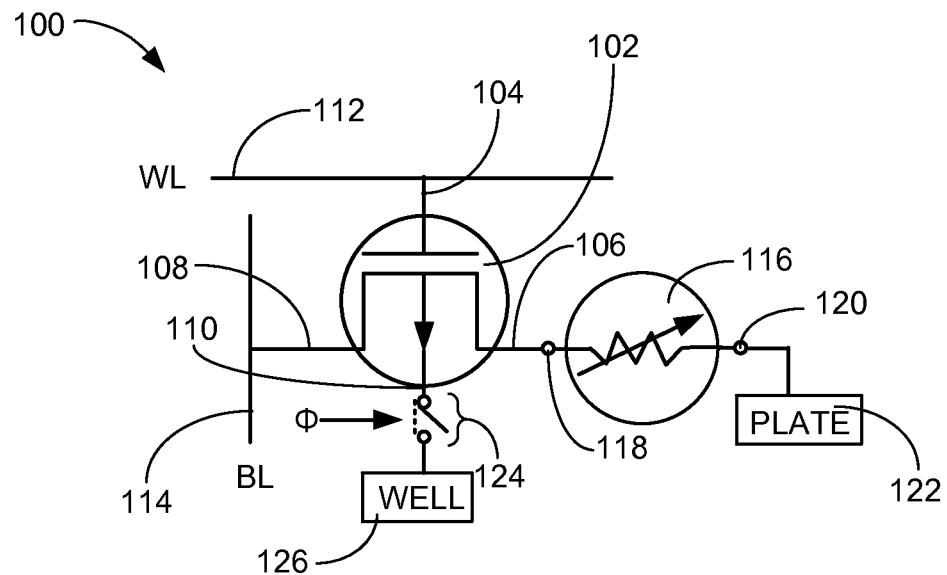
FIG. 1 is a schematic diagram of a portion of a non-volatile memory system with reset control mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. For expository purposes, the term "horizontal" as used herein is defined as a plane parallel to the plane or surface of the integrated circuit, having the non-volatile memory system, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening elements.

The term "processing" as used herein includes deposition of material or photoresist, patterning, exposure, development, etching, cleaning, and/or removal of the material or photoresist as required in forming a described structure. The phrase "resistive memory" is defined to be a semiconductor structure that is programmable between a low resistance state and a high resistance state, where the high resistance state is at least an order of magnitude higher resistance value than the low resistance state.

Referring now to FIG. 1, therein is shown a schematic diagram of a portion of a non-volatile memory system 100 with reset control mechanism in an embodiment of the present invention. The schematic diagram of the non-volatile memory system 100 depicts a control field effect transistor 102, such as a P-FET, having a gate electrode 104, a source electrode 106, a drain electrode 108, and a body-tie electrode 110.

A word line 112 can be coupled to the gate electrode 104 of the control field effect transistor 102. It is understood that the word line 112 can be coupled to other instances of the control field effect transistor 102 for forming an array.

A bit line 114 can be coupled to the drain electrode 108 of the control field effect transistor 102. It is understood that the bit line 114 can be coupled to other instances of the control field effect transistor 102 that are coupled to a different instance of the word line 112 for forming the array.

A resistive storage element 116 can be coupled to the source electrode 106 of the control field effect transistor 102 through a first electrode 118. The resistive storage element 116 can have a second electrode 120 that is coupled to a plate voltage 122. When programming the resistive storage element 116, the plate voltage can be between 1.0 and 3.5 volts. When resetting the resistive storage element 116, the plate voltage 122 can be substantially ground or Vss. The plate voltage 122 can provide a reference voltage when programming or resetting the resistive storage element 116.

A well switch 124 can be coupled between the body-tie electrode 110, of the control field effect transistor 102, and a well voltage 126. During programming and reading operations the well switch 124 is closed in order to reference the voltage at the source electrode 106 to the well voltage 126. It is understood that the well voltage 126 can reflect the voltage in the well region, in which the control field effect transistor 102 is fabricated. The well voltage 126 can be in the range of 0 to 0.7 volts.

During the reset operation of the non-volatile memory system 100, the well switch 124 can be opened for a period Φ and then return to a closed position in order to prevent a latch-up condition in the control field effect transistor 102. During the period Φ, with the well switch 124 open, the well voltage 126 can increase from 0 volts due to charge accumulation in the well region.

The open state of the well switch 124 can provide a higher voltage at the first electrode 118 of the resistive storage element 116 for executing a reset of the resistive storage element 116. The voltage provided from the source electrode 106 can be represented by the following equation:

$$V_{bs} = V_{plate} - (V_{gate} - V_{threshold}) + \Delta V \quad (1)$$

Where $V_{bs}$ is the voltage applied to the first electrode 118;

$V_{plate}$ is equal to $V_{ss}$ for the reset operation;

$V_{gate}$ is equal to the gate reset voltage of approximately 3.0 volts;

$V_{threshold}$ is the set by the design of the control field effect transistor 102 and can be in the range of 0.3V to 0.6V based on the physical geometry of the control field effect transistor 102; and $\Delta V$ is equal to the voltage rise of the well region, due to charge accumulation, when the well switch 124 is open. $\Delta V$ can be in the range of 0V to 0.7V.

It has been discovered that the opening of the well switch 124 for the period Φ during the reset of the resistive storage element 116 can provide additional voltage across the resistive storage element 116 that is not available when the well switch is closed. The presence of the additional voltage can provide a faster and more certain transition of the resistive storage element 116 between the low resistance state and the high resistance state.

It is understood that the well switch 124 is shown as a mechanical switch by way of an example only for ease of explanation and the actual implementation will be different. It is further understood that only a single instance of the non-volatile memory system 100 is depicted though more than one can be present in the implementation.

Figure 2:
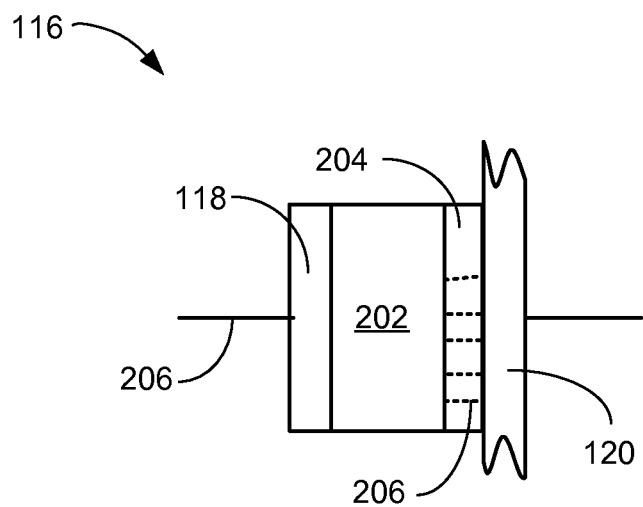
FIG. 2 is a cross-sectional view of the resistive storage element of FIG. 1.

Referring now to FIG. 2, therein is shown a cross-sectional view of the resistive storage element 116. The cross-sectional view of the resistive storage element 116 depicts the first electrode 118 in direct contact with a conductive layer 202. The first electrode 118 can be a metal structure formed of nickel (Ni), tin (Sn), copper (Cu) or an alloy of a conductive metal. The conductive layer 202 can be alloys of Tellurium (Te), known as Telluride, such as Copper-Tellurium (CuTe).

A transformation layer 204 is in direct contact with the conductive layer 202. The transformation layer 204 can be gadolinium oxide (GdOx) and provides a switching function that can conduct electrons between the conductive layer 202 and the second electrode 120. The transformation layer 204 can be altered by applying a voltage across the first electrode 118 and the second electrode 120. The application of the voltage can cause ions from the conductive layer 202 to migrate into the transformation layer 204 in order to form conductive threads 206 through the transformation layer 204. By reversing the polarity of the voltage across the first electrode 118 and the second electrode 120, the conductive threads 206 can be broken and the ions will migrate back into the conductive layer 202 and returning the transformation layer 204 to its initial state.

It has been discovered that the resistive storage element can maintain a resistive state without an electrical supply and can transition between resistive states, by the application of a low voltage direct current signal, with high reliability. Once the conductive threads 206 are formed between the conductive layer 202 and the second electrode 120, they will remain in place until they are forces to break by applying the reverse voltage.

It is understood that the method of fabrication the resistive storage element 116 can be in a different orientation than what is shown. The first electrode 118 and the second electrode 120 can be coupled to interconnect layers 206 for incorporation into switching and monitoring circuits.

Figure 3:
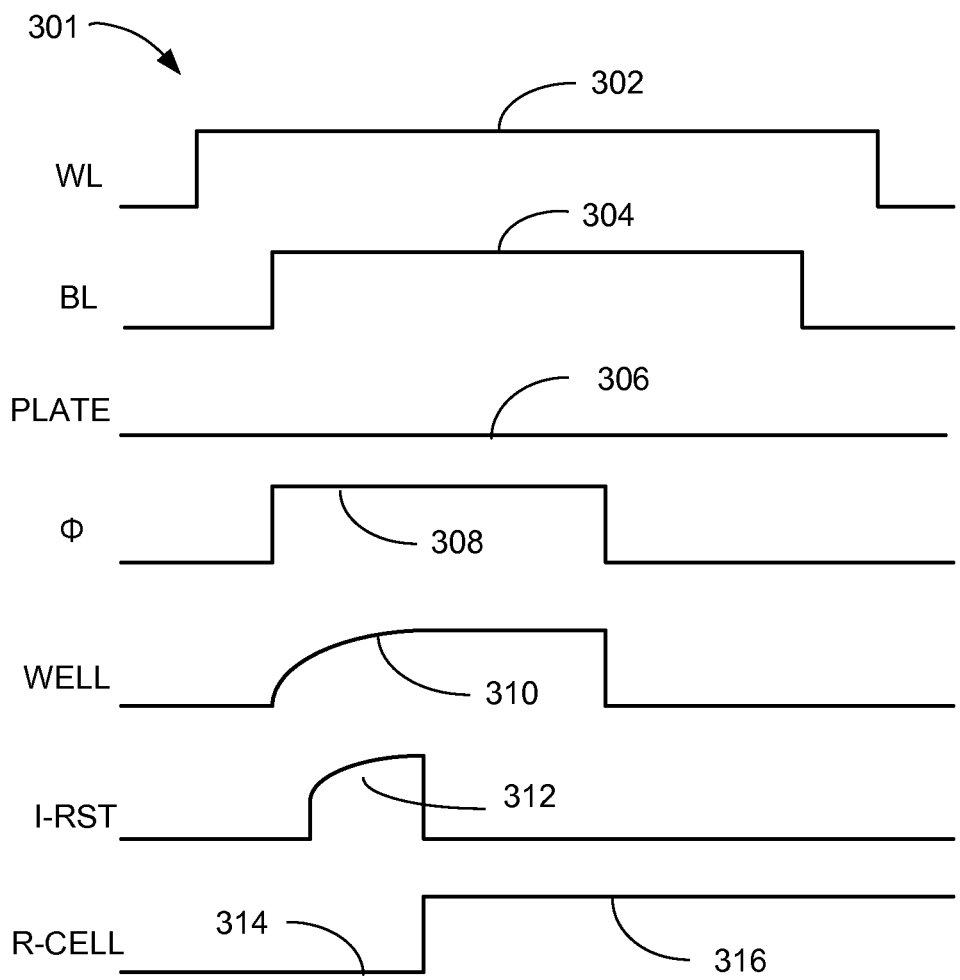
FIG. 3 is a timing diagram of the operation of the non-volatile memory system of FIG. 1.

Referring now to FIG. 3, therein is shown a timing diagram 301 of the operation of the non-volatile memory system 100 of FIG. 1. The timing diagram 301 depicts a word line signal 302 that can transition between 0.1V and greater than 2.0V in preparation for initiating a reset of the resistive storage element 116 of FIG. 1. During a reset process of the resistive storage element 116, an entire array of the resistive storage element 116 can be selected for reset. In this instance multiple of the word line 112 of FIG. 1 can be activated concurrently.

A bit line signal 304 can transition between 0.1V and greater than 2.0V. The bit line signal 304 can be asserted for an array of the resistive storage element 116 and each of the resistive storage element 116 can be reset concurrently. Due to the loading of an entire array of the resistive storage element 116, any additional voltage that can be delivered can reduce the amount of time required to switch states.

A plate voltage signal 306 can be fixed at 0V in order to provide a path for electrons (not shown) from the source electrode 106 of FIG. 1 to propagate through the resistive storage element 116. A well switch input signal 308 can open the well switch 124 of FIG. 1 for the period Φ as indicated by the positive portion of the well switch input signal 308. As soon as the well switch 124 opens a well voltage signal 310 starts to increase from approximately 0V to 0.7V. This increase in the well voltage can cause a linear increase in a reset current signal 312.

The additional current that is applied to the resistive storage element 116 can cause a transition from a low resistance state 314 to a high resistance state 316. The switching to the high resistance state 316 can cause the reset current signal 312 to drop to a low level in an inverse linear relation to the increase in the resistance of the resistive storage element 116.

It is understood that the timing diagram 301 is indicated to explain the operation of a single instance of the non-volatile memory system 100 and the actual signals, while resetting the array of the resistive storage element 116, will differ. It has been discovered that the increase well voltage signal 310 can float the voltage applied to the first electrode 118 of FIG. 1. The resultant effect can increase the probability that the resistive storage element 116 will transition from the low resistance state 314 to the high resistance state 316 in a first reset attempt.

Figure 4:
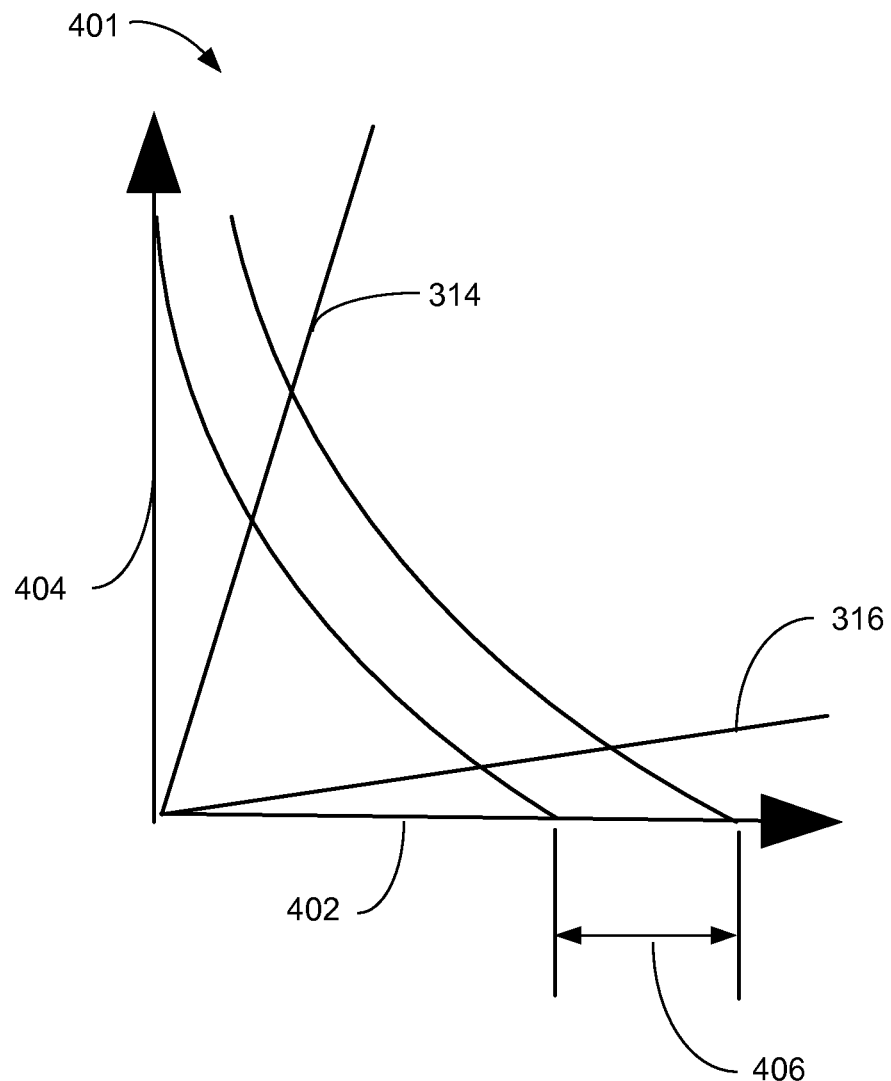
FIG. 4 is a line graph of a resistive characteristic of an exemplary cell of the non-volatile memory system of FIG. 1

Referring now to FIG. 4, therein is shown a line graph of a resistive characteristic 401 of an exemplary cell of the non-volatile memory system 100 of FIG. 1. The line graph of the resistive characteristic 401 depicts a Cartesian coordinate system having a first electrode voltage 402 on the X-axis and a reset current 404 on the Y-axis. A straight-line estimation of the high resistance state 316 of the resistive storage element 116 of FIG. 1 is plotted in the first quadrant. A straight-line estimation of the low resistance state 314 of the resistive storage element 116 is plotted in the first quadrant also. There is approximately an order of magnitude difference in the resistance values between the low resistance state 314 and the high resistance state 316.

A delta voltage 406 can represent the additional voltage provided to the resistive storage element 116 as a result of opening the well switch 124 of FIG. 1 The resulting transition from the low resistance state 314 to the high resistance state 316 starts with a higher value of the reset current 404.

It has been discovered that the delta voltage 406 provided by the opening of the well switch 124 can increase the probability that all of the instances of the resistive storage element 116 will transition between the low resistance state 314 and the high resistance state 316 in a shorter period of time, thus enhancing the reset performance and reducing the number of iterative reset attempts required to reset the block of the resistive storage element 116.

Figure 5:
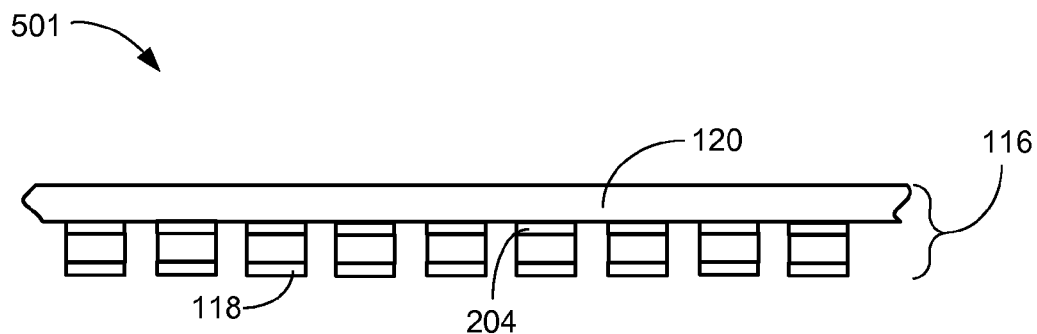
FIG. 5 is a cross-sectional view of an array of the resistive storage element of FIG. 1.

Referring now to FIG. 5, therein is shown a cross-sectional view of an array 501 of the resistive storage element 100 of FIG. 1. The cross-sectional view of the array 501 depicts the resistive storage element 116. The second electrode 120 can extend over a number of the transformation layer 204. Each of the resistive storage element 116 can have a separate first electrode 118.

During the reset process, the second electrode 120 is set to $V_{ss}$ and each of the first electrode 118 is elevated to a reset voltage as represented by $V_{bs}$ as represented in equation 1.

Figure 6:
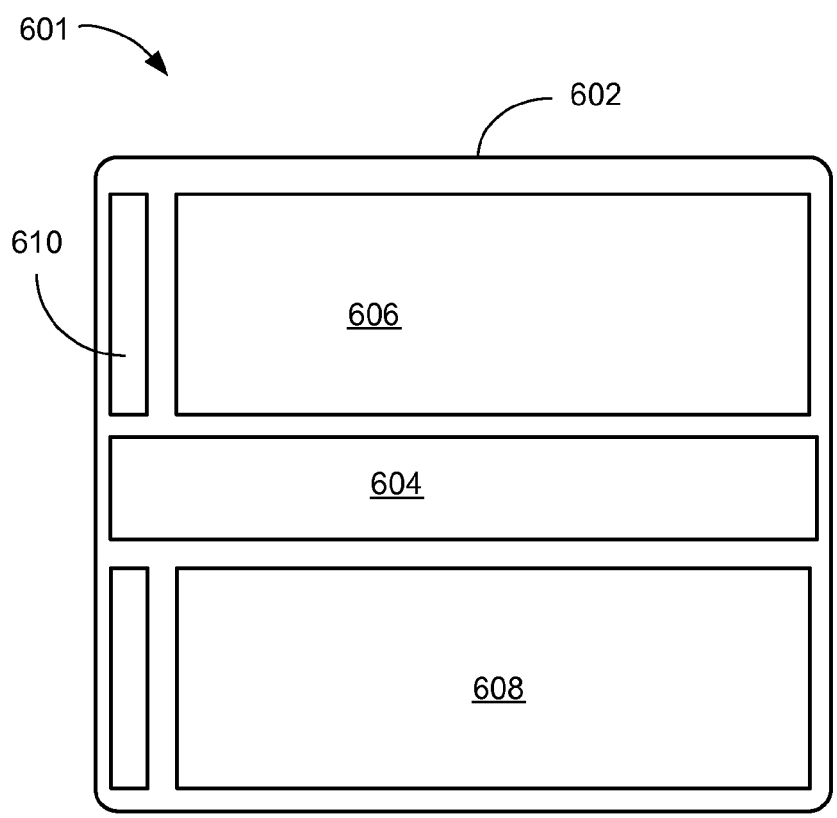
FIG. 6 is a block diagram of a non-volatile memory device constructed with the non-volatile memory system of FIG. 1.

Referring now to FIG. 6, therein is shown a block diagram of a non-volatile memory device 601 constructed with the non-volatile memory system 100 of FIG. 1. The block diagram of the non-volatile memory device 601 depicts an integrated circuit die 602 having a control block 604 positioned between a first array 606 and a second array 608. The first array 606 and the second array 608 include the non-volatile memory system 100 as well as the interconnect layers 206 of FIG. 2.

An address driver 610 can be positioned adjacent to the first array 606 and the second array 608. The address driver 610 can control the word line signal 302 of FIG. 3 and propagation timing. The address driver 610 can coordinate the addressing of blocks or individual cell with the assistance of the control block 604. The control block 604 can propagate the bit line signal 304 of FIG. 3, control the voltage level of the plate signal 306 of FIG. 3, control the opening and closing of the well switch 124 of FIG. 1, and detect the transition from the low resistance state 314 of FIG. 3 to the high resistance state 316 of FIG. 3.

It has been discovered that the non-volatile memory device 601 can provide a highly reliable, manufacturable, and good yielding integrated circuit solution for high capacity and long term non-volatile memory applications. The fabrication of the well switch 124 is straight forward and its manipulation by the control block 604 provides extra margin to the operation of the non-volatile memory device 601. The non-volatile memory device 601 can be fabricated in complementary metal oxide semiconductor (CMOS) processes, such as 180 ηm CMOS technology.

Figure 7:
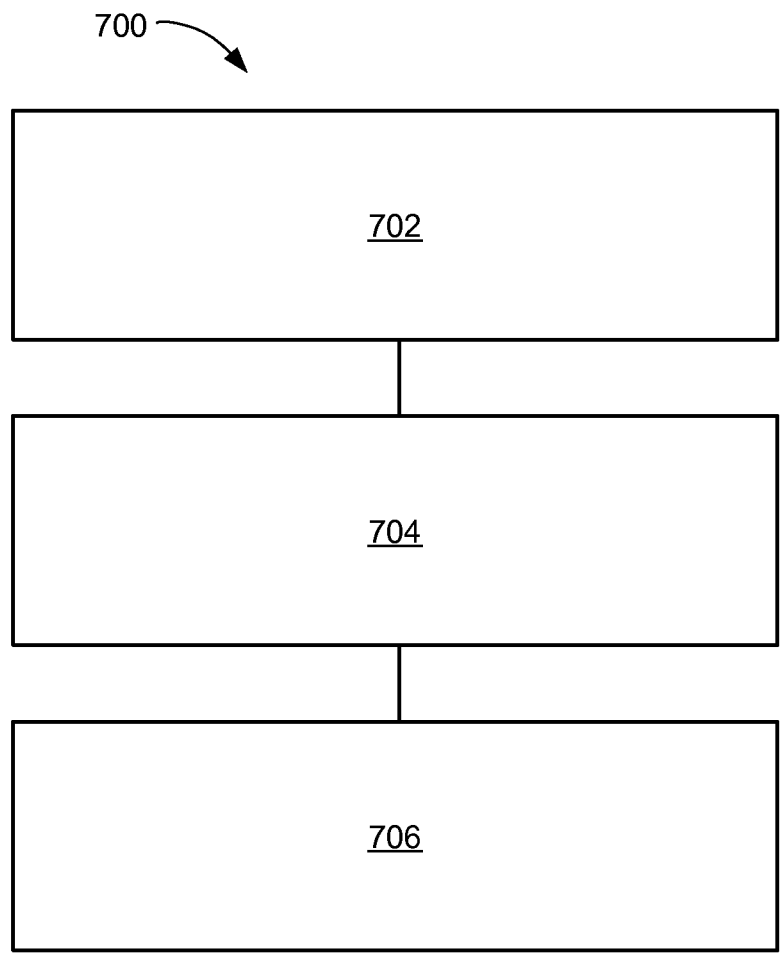
FIG. 7 is a flow chart of a method of operation of a non-volatile memory system in a further embodiment of the present invention.

Referring now to FIG. 7, therein is shown a flow chart of a method 700 of operation of a non-volatile memory system in a further embodiment of the present invention. The method 700 includes: providing a control field effect transistor having a source electrode and a body-tie electrode in a block 702; coupling a resistive storage element to the source electrode in a block 704; and opening a well switch coupled to the body-tie electrode for increasing a well voltage and resetting the resistive storage element by the source electrode floating on the well voltage in a block 706.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A non-volatile memory system comprising:
   a control field effect transistor having a source electrode and a body-tie electrode;
   a resistive storage element coupled to the source electrode; and
   a well switch, coupled to the body-tie electrode, opened for increasing a well voltage and the resistive storage element reset with the source electrode elevated by the well voltage.

2. The system as claimed in claim 1 wherein the resistive storage element reset includes a low resistance state transitioned to a high resistance state.

3. The system as claimed in claim 1 further comprising:
   a first electrode, of the resistive storage element, coupled to the source electrode; and
   a second electrode, of the resistive storage element, coupled to a plate voltage for establishing a voltage reference for the resistive storage element.

4. The system as claimed in claim 1 further comprising:
   a drain electrode, of the control field effect transistor, coupled to a bit line; and
   a gate electrode, of the control field effect transistor, coupled to a word line for addressing the resistive storage element.

5. The system as claimed in claim 1 further comprising a control block for coordinating the opening of the well switch for resetting the resistive storage element.

6. The system as claimed in claim 1 further comprising:
   a conductive layer in direct contact with a transformation layer in the resistive storage element; and
   a conductive thread formed in the transformation layer dissociated by the reset of the resistive storage element.

7. The system as claimed in claim 6 wherein the resistive storage element reset includes a low resistance state transitioned to a high resistance state and the conductive thread dissociated back into the conductive layer.

8. The system as claimed in claim 6 further comprising:
   a first electrode, of the resistive storage element, coupled to the source electrode; and
   a second electrode, of the resistive storage element, coupled to a plate voltage for establishing a voltage reference for the resistive storage element includes the conductive thread formed or dissociated.

9. The system as claimed in claim 6 further comprising:
   a drain electrode, of the control field effect transistor, coupled to a bit line includes a control block for signaling on the bit line; and
   a gate electrode, of the control field effect transistor, coupled to a word line for addressing the resistive storage element includes an address driver coupled to the word line for signaling on the word line.

10. The system as claimed in claim 6 further comprising a control block for coordinating the opening of the well switch for resetting the resistive storage element includes the well voltage increased by charge accumulation.

* * * * *